United States Patent
Jeong

(10) Patent No.: US 9,130,350 B2
(45) Date of Patent: Sep. 8, 2015

(54) LASER DEVICE THAT INCLUDES RING RESONATOR

(71) Applicant: FUJITSU LIMITED, Kawasaki-shi, Kanagawa (JP)

(72) Inventor: Seokhwan Jeong, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 153 days.

(21) Appl. No.: 14/332,771

(22) Filed: Jul. 16, 2014

(65) Prior Publication Data

US 2015/0222089 A1    Aug. 6, 2015

Related U.S. Application Data

(63) Continuation of application No. PCT/JP2012/052187, filed on Jan. 31, 2012.

(51) Int. Cl.
*H01S 5/14* (2006.01)
*H01S 5/10* (2006.01)
*G02F 1/01* (2006.01)
*G02F 1/015* (2006.01)

(52) U.S. Cl.
CPC ............ *H01S 5/14* (2013.01); *H01S 5/1028* (2013.01); *H01S 5/146* (2013.01); *G02F 1/011* (2013.01); *G02F 1/015* (2013.01)

(58) Field of Classification Search
CPC ..... H01S 5/101; H01S 5/1021; H01S 5/2028; G02F 1/011; G02F 1/015
See application file for complete search history.

(56) References Cited

U.S. PATENT DOCUMENTS

| | | | |
|---|---|---|---|
| 5,353,295 A * | 10/1994 | Holonyak et al. | 372/50.12 |
| 6,668,006 B1 * | 12/2003 | Margalit et al. | 372/97 |
| 2003/0133176 A1 * | 7/2003 | Abeles | 359/240 |
| 2004/0062483 A1 * | 4/2004 | Taghavi-Larigani et al. | 385/39 |

(Continued)

FOREIGN PATENT DOCUMENTS

| | | |
|---|---|---|
| JP | 5-323389 A | 12/1993 |
| JP | 2004-144963 A | 5/2004 |

(Continued)

OTHER PUBLICATIONS

Poon et al., "Designing coupled-resonator optical waveguide delay lines", Journal of the Optical Society of America B, vo. 21, No. 9, pp. 1665-1673 (2004).*

(Continued)

*Primary Examiner* — Eric Bolda
(74) *Attorney, Agent, or Firm* — Fujitsu Patent Center

(57) ABSTRACT

A laser device includes: an optical amplifier; a first reflector configured to reflect light output from the first optical end face of the optical amplifier; a ring resonator; an input optical waveguide optically coupled to the ring resonator; a reflector optical waveguide optically coupled to the ring resonator; a second reflector configured to reflect light that propagates in the reflector optical waveguide; an output optical waveguide; and a delay interferometer that includes first and second optical couplers and a pair of optical waveguides formed between the first optical coupler and the second optical coupler. The second optical end face of the optical amplifier and one port of the first optical coupler are optically coupled. A first port of the second optical coupler and the input optical waveguide are optically coupled. A second port of the second optical coupler and the output optical waveguide are optically coupled.

11 Claims, 18 Drawing Sheets

(56) References Cited

U.S. PATENT DOCUMENTS

| | | |
|---|---|---|
| 2006/0198416 A1 | 9/2006 | Yamazaki |
| 2006/0222038 A1 | 10/2006 | Yamazaki |
| 2006/0222039 A1 | 10/2006 | Yamazaki |
| 2008/0025358 A1 | 1/2008 | Arahira |
| 2008/0056311 A1 | 3/2008 | Takeuchi et al. |
| 2009/0092159 A1 | 4/2009 | Kato |
| 2009/0285251 A1 | 11/2009 | Yamazaki |
| 2009/0303492 A1 | 12/2009 | Asano et al. |
| 2010/0246612 A1 | 9/2010 | Shimizu |
| 2011/0038036 A1* | 2/2011 | Todt ............... 359/341.1 |
| 2014/0126601 A1* | 5/2014 | Jeong ............... 372/50.11 |

FOREIGN PATENT DOCUMENTS

| | | |
|---|---|---|
| JP | 2005-327881 A | 11/2005 |
| JP | 2006-245344 A | 9/2006 |
| JP | 2006-278769 A | 10/2006 |
| JP | 2006-278770 A | 10/2006 |
| JP | 2008-034657 A | 2/2008 |
| JP | 2008-060445 A | 3/2008 |
| JP | 2009-059729 A | 3/2009 |
| JP | 2009-200091 A | 9/2009 |
| JP | 2009-278015 A | 11/2009 |
| JP | 2009-300540 A | 12/2009 |
| JP | 2010-027664 A | 2/2010 |
| JP | 2010-212472 A | 9/2010 |
| JP | 2010-212610 A | 9/2010 |
| JP | 2011-253930 A | 12/2011 |
| WO | 2009/054526 A1 | 4/2009 |

OTHER PUBLICATIONS

International Search Report, mailed in connection with PCT/JP2012/052187 and mailed on Mar. 6, 2012.

Notification of Transmittal of Translation of the International Preliminary Report on Patentability (Form PCT/IB/338, PCT/IB/373 & Form PCT/ISA/237), PCT/JP2012/052187, 6 pages, dated Aug. 14, 2014.

* cited by examiner

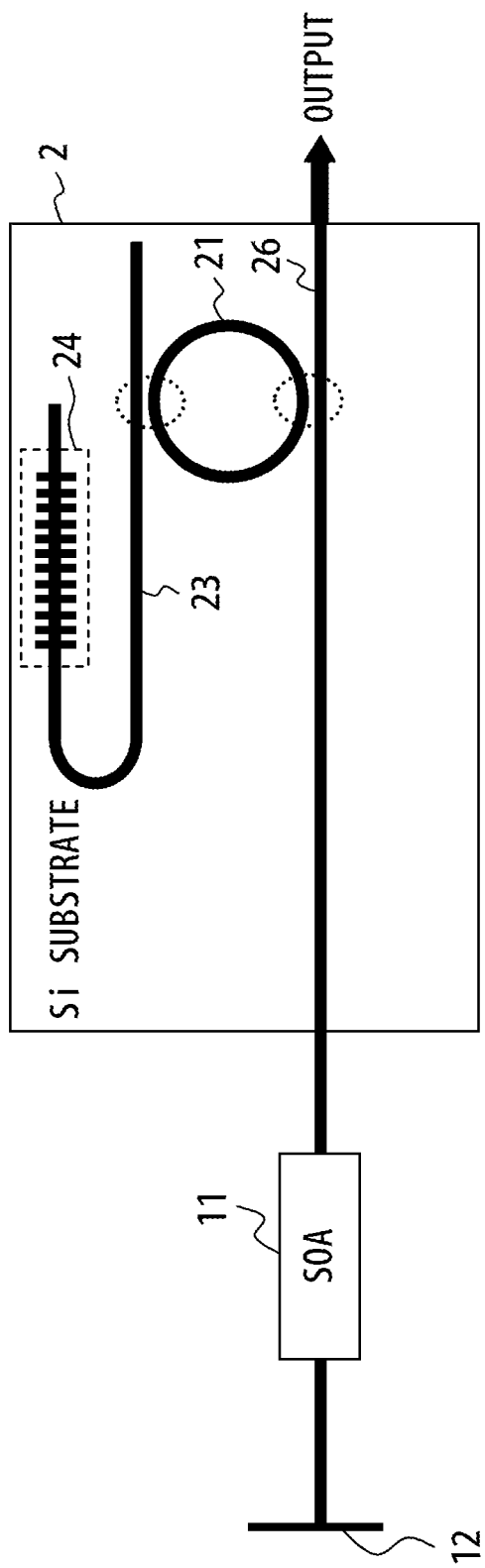
F I G. 5

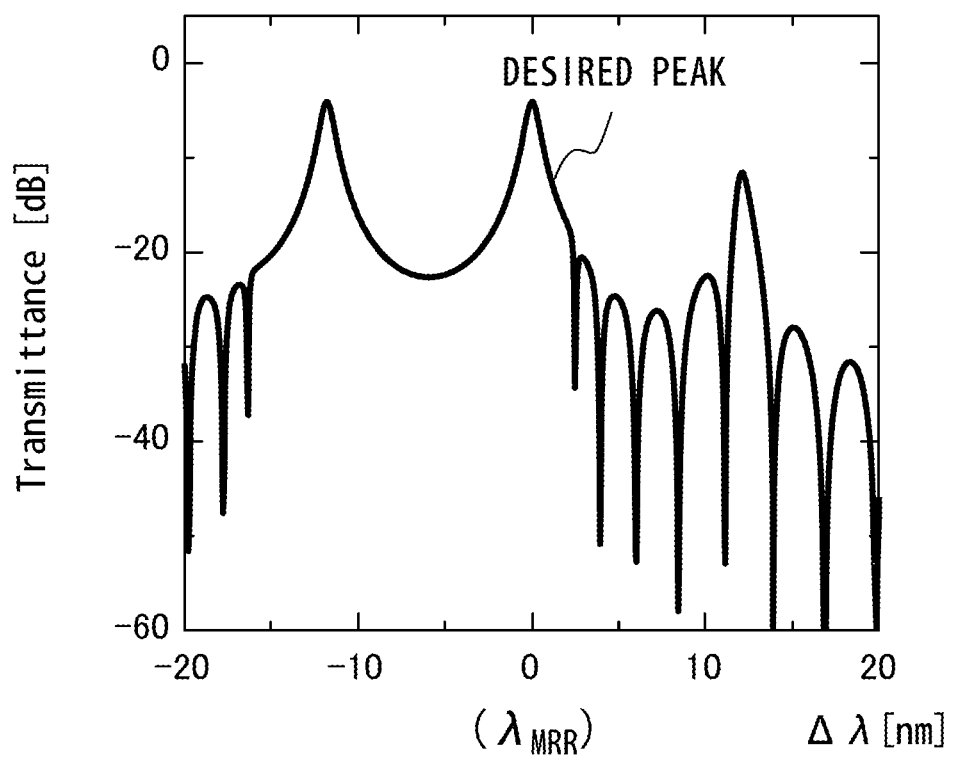
F I G. 8

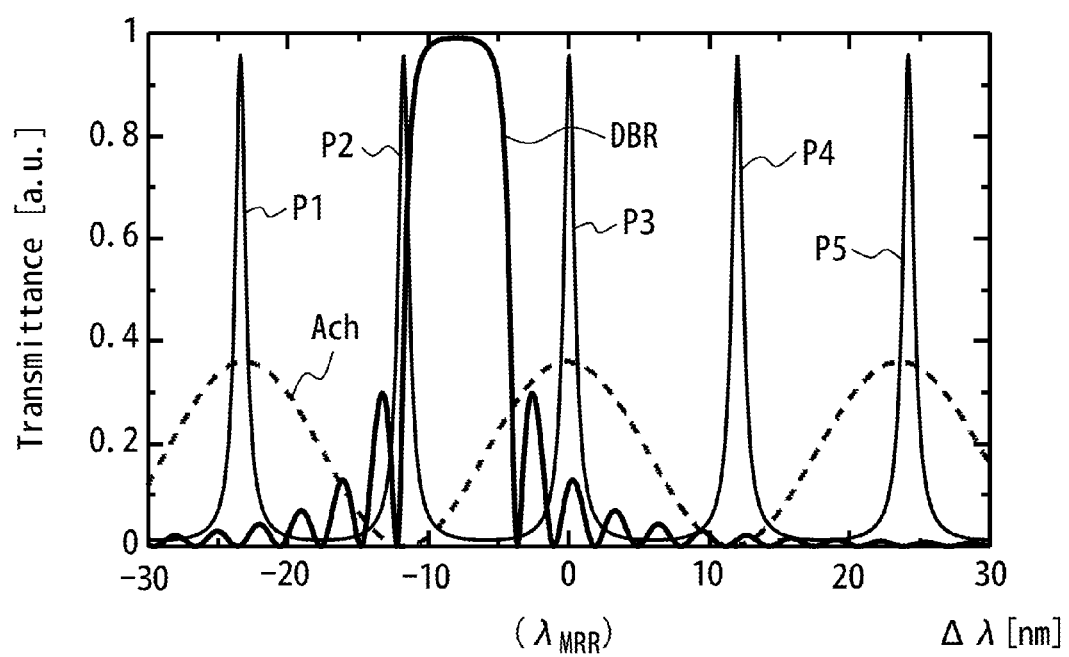
F I G. 10

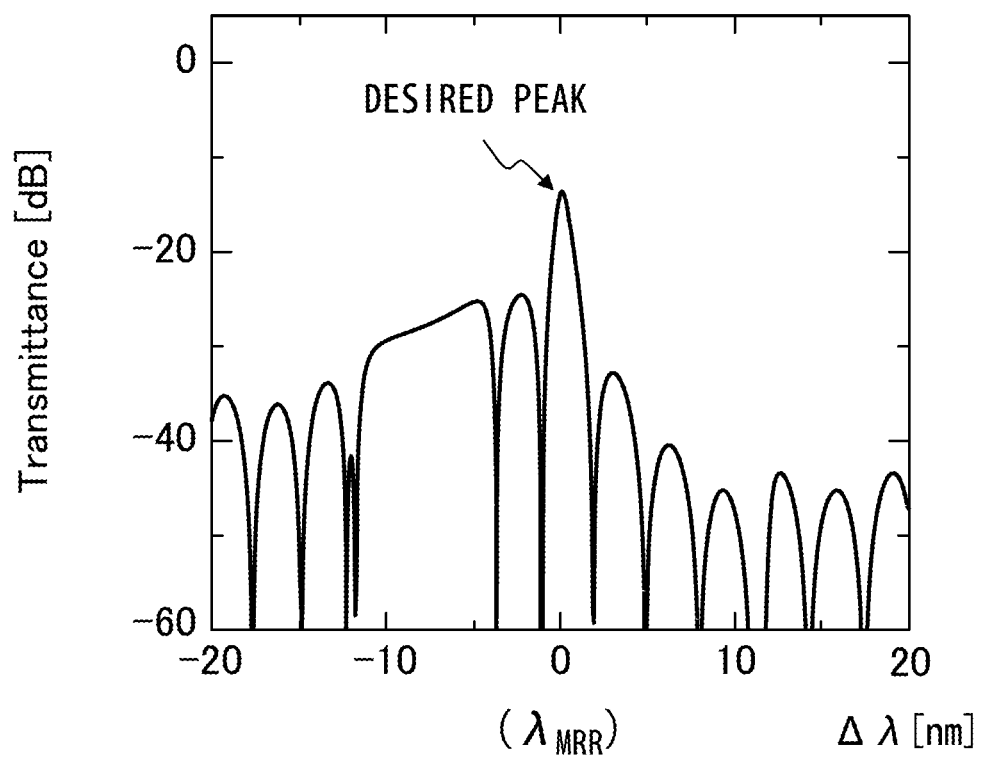
F I G. 1 1

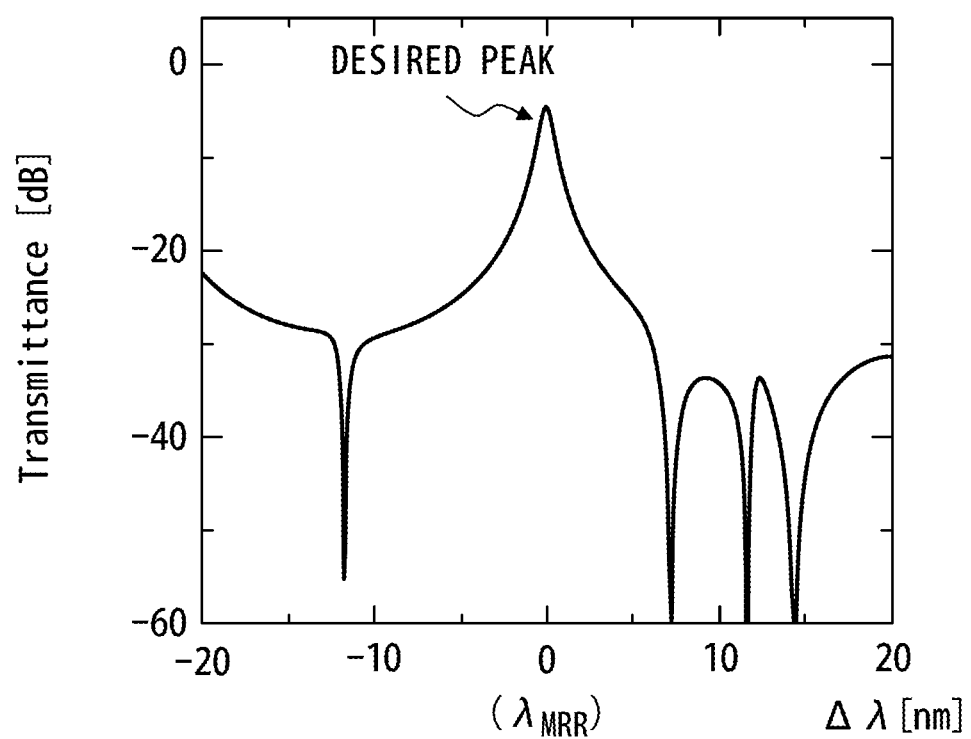
F I G. 14

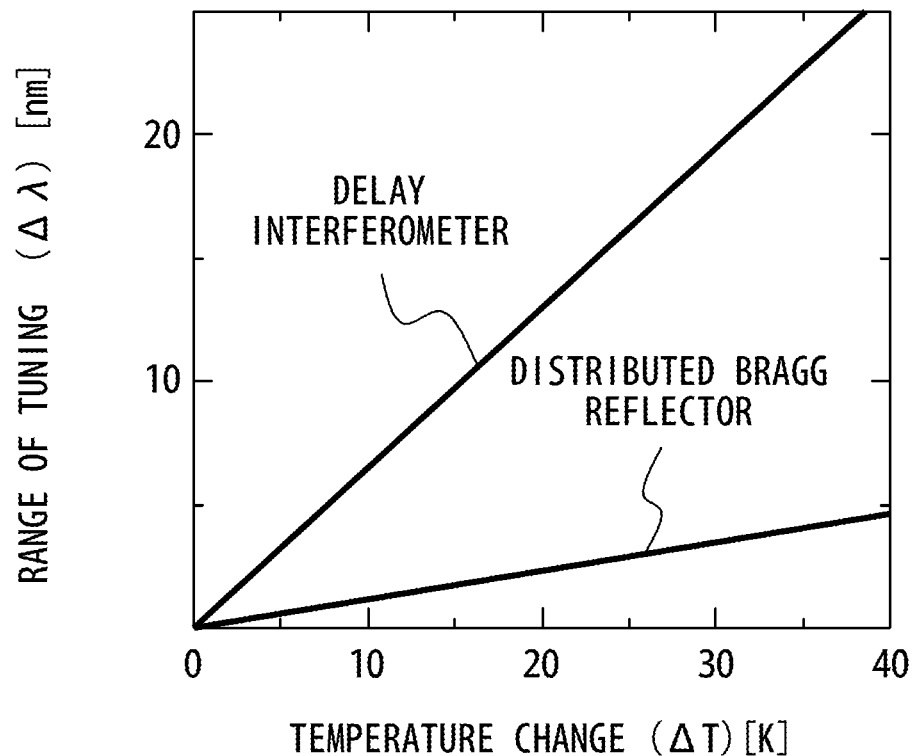
F I G. 1 6

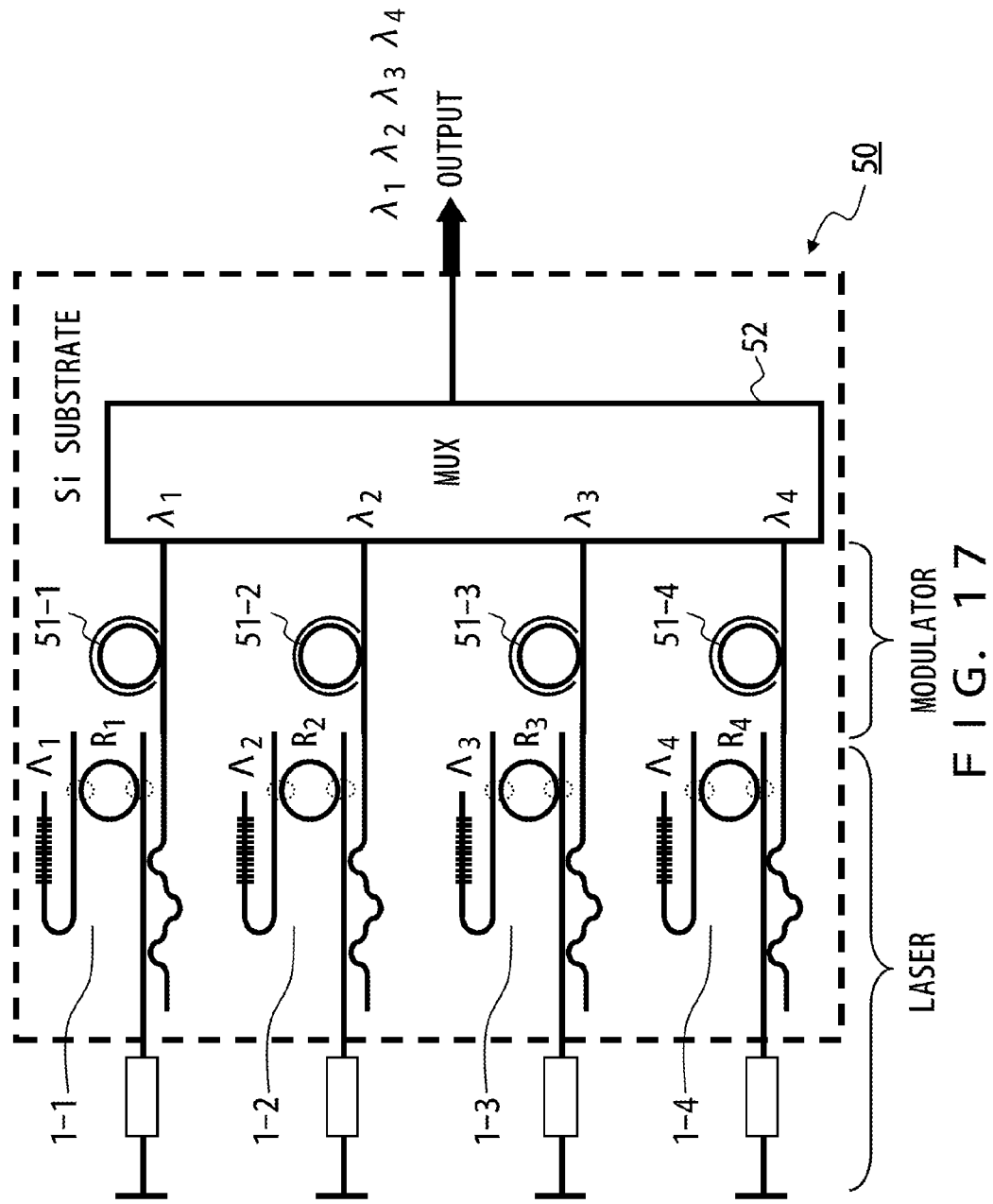
F I G. 17

LASER DEVICE THAT INCLUDES RING RESONATOR

CROSS-REFERENCE TO RELATED APPLICATION

This application is a continuation application of International Application PCT/JP2012/052187 filed on Jan. 31, 2012 and designated the U.S., the entire contents of which are incorporated herein by reference.

FIELD

The embodiments discussed herein are related a laser device including a ring resonator.

BACKGROUND

In recent years, accompanying the development of optical interconnecting techniques, there is demand for the realization of integrated optical transceivers that are suitable for cost reduction. As a technique of realizing such integrated optical transceivers, silicon (Si) photonics is drawing attention. For example, an external resonator laser is proposed that has a configuration in which a light emission element of a III-V compound semiconductor is formed on a silicon substrate so as to control oscillation modes by using a silicon waveguide filter.

FIG. 1 and FIG. 2 illustrate examples of external resonator lasers. In the configuration illustrated in FIG. 1, oscillation occurs between a pair of reflectors Rb and Rf. In the configuration illustrated in FIG. 2, light output from the Semiconductor Optical Amplifier (SOA) to the silicon waveguide returns to the SOA via ring resonators R1 and R2. The light returned from the silicon waveguide is reflected by the reflector Rb and is output to the silicon waveguide again. This causes oscillation. The wavelength of generated laser light is determined by the resonation wavelength of the ring resonators R1 and R2 in the external resonator lasers illustrated in FIG. 1 and FIG. 2.

The configuration illustrated in FIG. 1 is described in for example Japanese Laid-open Patent Publication No. 2006-245344. The configuration illustrated in FIG. 2 is described in for example Japanese Laid-open Patent Publication No. 2009-200091. Further, another related technique is described in Japanese Laid-open Patent Publication No. 2008-34657.

In the configurations illustrated in FIG. 1 and FIG. 2, in order to meet the conditions for the single oscillation mode, it is necessary to accurately control the resonation wavelength of the ring resonators R1 and R2 having different diameters. Accordingly, when the wavelength of the ring resonators shifts due to temperature change or the like, there is a possibility that the oscillation characteristics deteriorate.

Laser light is emitted from the SOAs in the configurations illustrated in FIG. 1 and FIG. 2. Accordingly, when for example the laser light is to be supplied to a device on a semiconductor substrate, optical axis alignment has to be performed, which is troublesome.

In the configuration illustrated in FIG. 1, it may be possible to obtain laser light on the semiconductor substrate by for example implementing the reflector Rf by using a half mirror. In such a case, however, output laser light is under influence of losses occurring in the ring resonators R1 and R2. Accordingly, it is difficult to generate high-power laser light efficiently in this configuration.

SUMMARY

According to an aspect of the embodiments, a laser device includes: an optical amplifier that has a first optical end face and a second optical end face; a first reflector configured to reflect light output from the first optical end face of the optical amplifier; a ring resonator; an input optical waveguide that is optically coupled to the ring resonator; a reflector optical waveguide that is optically coupled to the ring resonator; a second reflector configured to reflect light that propagates in the reflector optical waveguide; an output optical waveguide; and a delay interferometer that includes a first optical coupler, a second optical coupler and a pair of optical waveguides formed between the first optical coupler and the second optical coupler. The second optical end face of the optical amplifier and one port of the first optical coupler are optically coupled. A first port of the second optical coupler and the input optical waveguide are optically coupled. A second port of the second optical coupler and the output optical waveguide are optically coupled.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 explains laser oscillation;

FIG. 8 illustrates a transmission spectrum obtained when a reflection bandwidth is broadened;

FIG. 10 illustrates a case where a reflection band is shifted with respect to a desired wavelength;

FIG. 11 illustrates the sum of the three spectrums illustrated in FIG. 10;

FIG. 14 illustrates the sum of the three spectrums illustrated in FIG. 13;

FIG. 16 illustrates a relationship between temperature control and wavelength tunable amounts;

FIG. 17 illustrates a configuration of an optical transmitter having a laser device of an embodiment.

DESCRIPTION OF EMBODIMENTS

Figure 1:
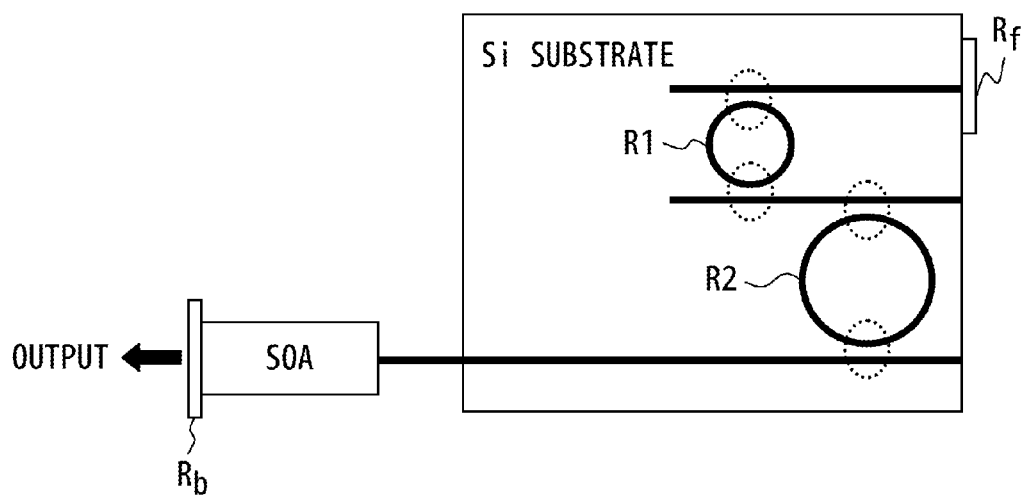
FIG. 1 illustrates an example of an external resonator laser.
Figure 2:
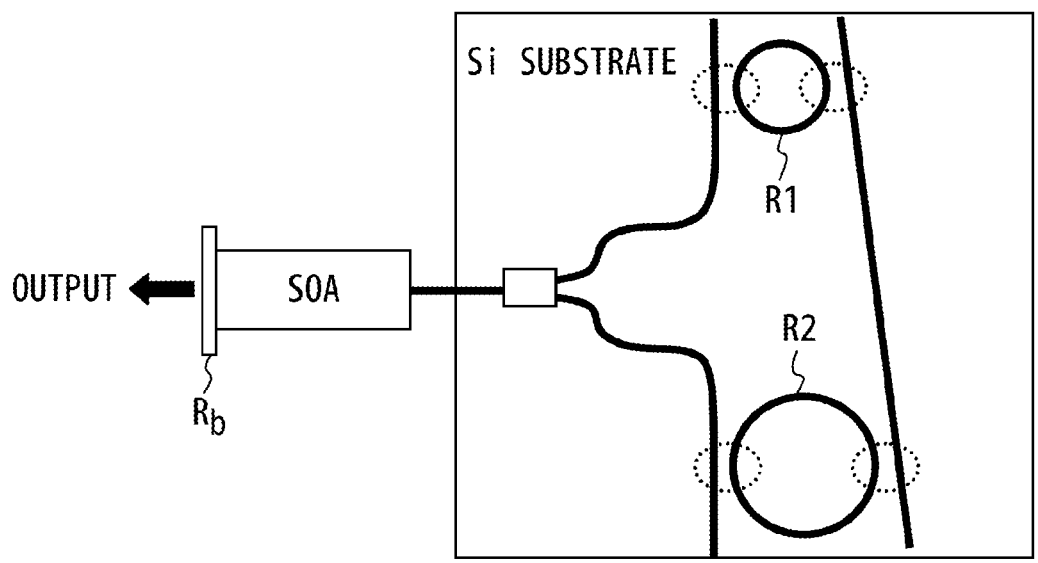
FIG. 2 illustrates another example of an external resonator laser.
Figure 3:
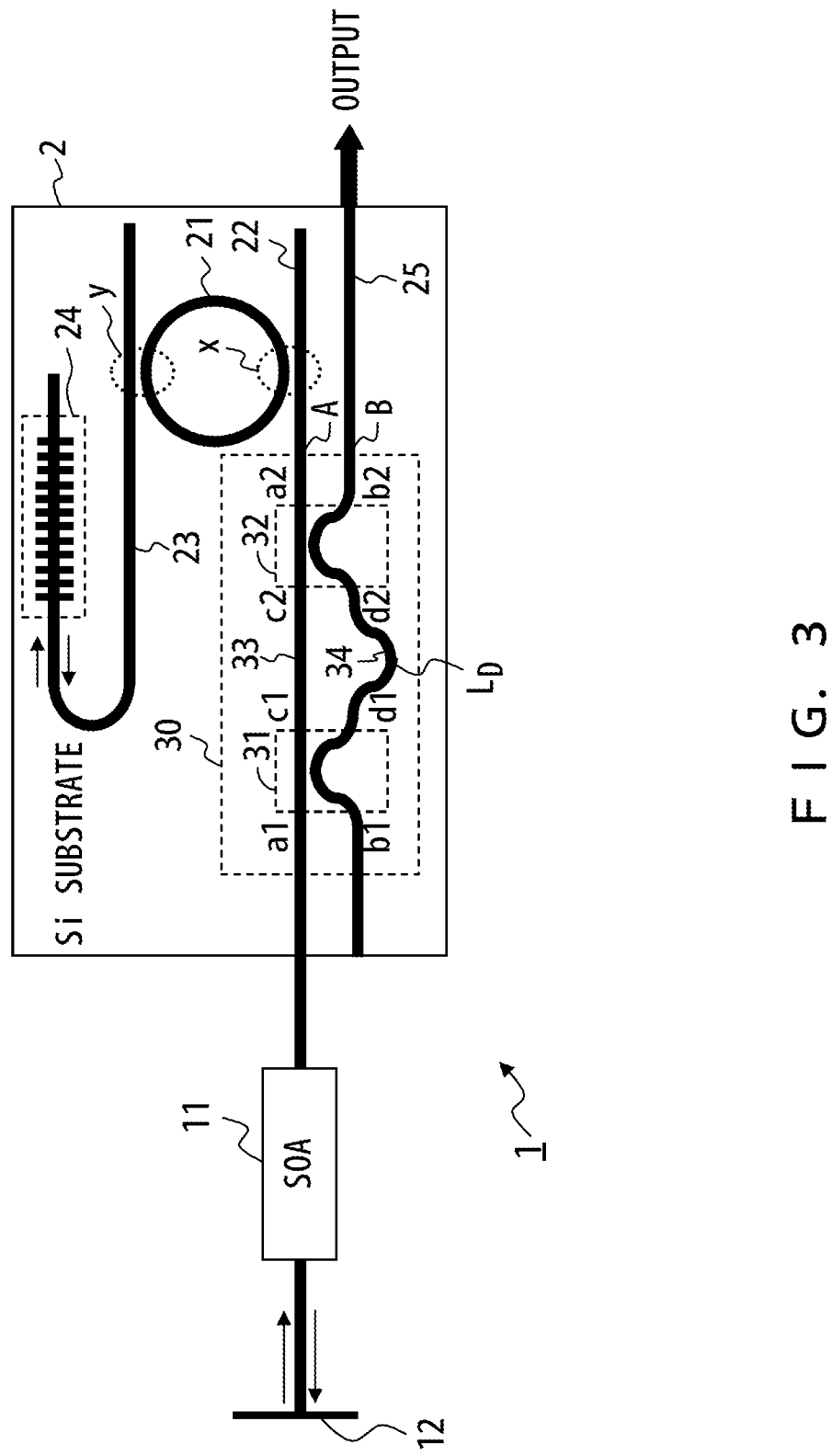
FIG. 3 illustrates a configuration of a laser device according to an embodiment.

FIG. 3 illustrates a configuration of a laser device according to an embodiment. A laser device 1 according to the embodiment includes an optical amplifier 11, a reflector 12, a ring resonator 21, an input optical waveguide 22, a reflector optical waveguide 23, a distributed Bragg reflector 24, an output optical waveguide 25 and a delay interferometer 30. The ring resonator 21, the input optical waveguide 22, the reflector optical waveguide 23, the distributed Bragg reflector 24, the output optical waveguide 25 and the delay interferometer 30 are formed on a semiconductor substrate 2. Materials of the semiconductor substrate 2 is not limited in particular, however, this example employs silicon (Si). Note that the ring resonator 21, the input optical waveguide 22, the reflector optical waveguide 23, the distributed Bragg reflector 24, the output optical waveguide 25 and the delay interferometer 30 works as an external resonator.

The Semiconductor Optical Amplifier (SOA) 11 is an InP-based semiconductor optical amplifier in this example although the scope of the present invention is not limited to this example. The optical amplifier 11 includes two optical end faces (a first optical end face and a second optical end face). Light output from the first optical end face is guided to the reflector 12. The reflector 12 is for example a total reflection mirror. Light reflected from the reflector 12 is guided to the first optical end face of the optical amplifier 11. Light output from the second optical end face of the optical amplifier 11 is guided to an optical coupler 31 in the delay interferometer 30. Light output from the optical coupler 31 in the delay interferometer 30 is guided to the second optical end face of the optical amplifier 11. In other words, the second optical end face of the optical amplifier 11 is optically coupled to port a1 of the optical coupler 31.

The ring resonator 21 is implemented by an optical waveguide that is formed in circle. The shape or radius of the ring resonator 21 is designed based on the wavelength of laser light generated by the laser device 1. For example, when laser light having the wavelength of 1550 nm is to be generated, the radius of the ring resonator 21 is approximately 8 μm. However, the shape of the ring resonator 21 does not necessarily have to be circular. The ring resonator 21 may operate as an add-drop type micro ring resonator (AD-MRR) in this example.

The input optical waveguide 22 is optically coupled to the ring resonator 21. In FIG. 3, the input optical waveguide 22 is optically coupled to the ring resonator 21 in region x. The optical coupling between the input optical waveguide 22 and the ring resonator 21 is implemented by narrowing the gap between the input optical waveguide 22 and the ring resonator 21 sufficiently. The input optical waveguide 22 is optically coupled to port a2 of an optical coupler 32 in the delay interferometer 30.

The reflector optical waveguide 23 is optically coupled to the ring resonator 21. In FIG. 3, the reflector optical waveguide 23 is optically coupled to the ring resonator 21 in region y. The optical coupling between the reflector optical waveguide 23 and the ring resonator 21 is implemented by narrowing the gap between the reflector optical waveguide 23 and the ring resonator 21 sufficiently.

The distributed Bragg reflector (DBR) 24 reflects light that propagates in the reflector optical waveguide 23. The cavity of laser is formed by the reflector 12 and the distributed Bragg reflector 24. The distributed Bragg reflector 24 has a reflection band that is determined by a grating coupling coefficient.

The output optical waveguide 25 is optically coupled to port b2 of the optical coupler 32 in the delay interferometer 30. Laser light generated by the laser device 1 is output through the output optical waveguide 25.

The delay interferometer 30 includes optical couplers 31 and 32 and a pair of optical waveguides 33 and 34 formed between the optical couplers 31 and 32. The optical coupler 31 is a 2:2 coupler and has four ports a1, b1, c1 and d1. Port a1 is optically coupled to the optical amplifier 11 as described above. Port b1 is open in this example. The coupler 32 is a 2:2 coupler and has four ports a2, b2, c2 and d2. The input optical waveguide 22 is optically coupled to port a2. The output optical waveguide 25 is optically coupled to the port b2.

Between the port c1 of the optical coupler 31 and the port c2 of the optical coupler 32, the optical waveguide 33 is formed. Between port d1 of the optical coupler 31 and port d2 of the optical coupler 32, the optical waveguide 34 is formed. In this example, the optical waveguide 33 and the optical waveguide 34 have different lengths. In this example, the length of the optical waveguide 34 is longer than that of the optical waveguide 33 by $L_D$. In other words, the delay interferometer 30 employs a configuration including a delay optical waveguide having length $L_D$ between ports d1 and d2.

Length $L_D$ corresponds to the half of the perimeter of the ring resonator 21. However, length $L_D$ does not have to be exactly the half of the perimeter of the ring resonator 21. "Half" used in this document means substantially half and may include a margin of error.

The optical couplers 31 and 32 are implemented by directional couplers in this example. However, the optical couplers 31 and 32 may be implemented by other devices. For example, the optical couplers 31 and 32 may also be implemented by Multimode Interference (MMI) couplers.

The optical feedback effect of the laser device 1 is based on a Fabry-Perot configuration including the reflector 12 and the distributed Bragg reflector 24. In such a case, the longitudinal mode spacing is determined by the Fabry-Perot resonator length.

Figure 4:
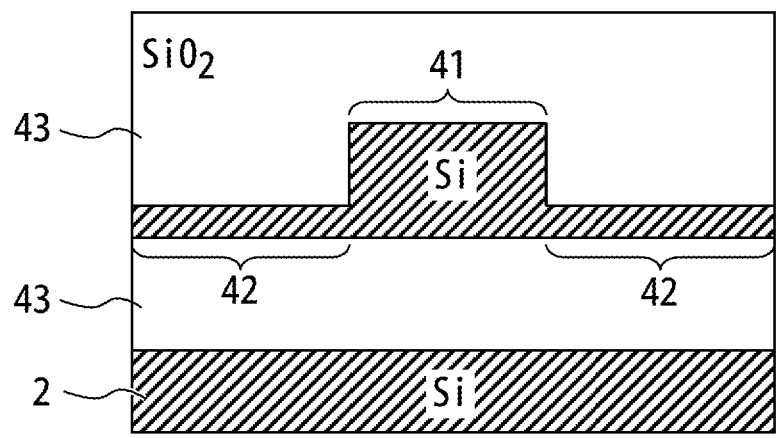
FIG. 4 illustrates a sectional configuration of an optical waveguide formed on a semiconductor substrate.

FIG. 4 illustrates a sectional configuration of an optical waveguide (the optical waveguide for the ring resonator 21, the input optical waveguide 22, the reflector optical waveguide 23, the output optical waveguide 25 and the optical waveguides 33 and 34) formed on the semiconductor substrate 2. In this example, it is assumed that the optical waveguide for the ring resonator 21, the input optical waveguide 22, the reflector optical waveguide 23, the output optical waveguide 25 and the optical waveguides 33 and 34 have substantially the same configuration.

As illustrated in FIG. 4, an optical waveguide includes a core region 41 and a slab region 42. The core region 41 and the slab region 42 are formed by for example crystal silicon. In this example, the core region 41 is 500 nm in width and 250 nm in height. The slab region 42 is 50 nm in thickness. The core region 41 and the slab region 42 are surrounded by the clad regions 43. The clad regions 43 are implemented by for example $SiO_2$.

<Operations of Laser Device 1>

In order to facilitate understanding of operations of the laser device 1, explanations will be given to the generation of laser light by referring to FIG. 5. It is assumed that the optical amplifier 11, the reflector 12, the ring resonator 21, the reflector optical waveguide 23 and the distributed Bragg reflector 24 are identical to their corresponding elements between FIG. 3 and FIG. 5. However, the laser device illustrated in FIG. 5 does not include the delay interferometer 30 illustrated in FIG. 3. Also, in the laser device illustrated in FIG. 5, an optical waveguide 26 is optically coupled to the optical amplifier 11 and is also optically coupled to the ring resonator 21. Generated laser light is output through the optical waveguide 26.

Figure 6:
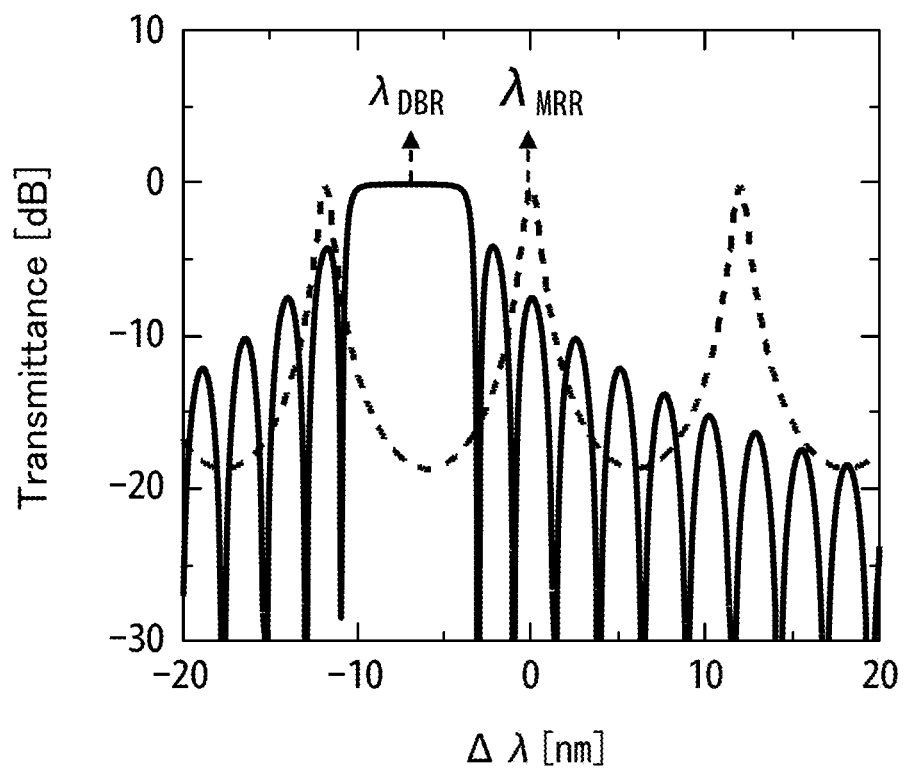
FIG. 6 illustrates characteristics of a ring resonator and a distributed Bragg reflector.

The transmittance of the ring resonator 21 has peaks cyclically with respect to wavelength as depicted by the dashed line in FIG. 6. The peak of transmittance of the ring resonator 21 may be referred to as a "resonance transmittance peak".

Also, a wavelength with which a resonance transmittance peak is obtained may be referred to as a "peak wavelength".

The cycle of the wavelength with which a resonance transmittance peak is obtained is determined by the optical perimeter (or optical path length) of the ring resonator 21. In the example illustrated in FIG. 6, resonance transmittance peaks are obtained at the spacing of approximately 12 nm. Note that the horizontal axis in FIG. 6 represents difference Δλ from desired wavelength $\lambda_{MRR}$, which is selected as a reference from among a plurality of peak wavelengths. Desired wavelength $\lambda_{MRR}$ is for example a wavelength with which the maximum resonance transmittance peak is obtained although the scope of the invention is not limited to this example particularly.

The distributed Bragg reflector 24 has a reflection band that is determined by a grating coupling coefficient. In other words, the reflectance of the distributed Bragg reflector 24 depends upon the wavelength of incident light. The laser device is designed so that desired wavelength $\lambda_{MRR}$ described above is sufficiently reflected by the distributed Bragg reflector 24. In other words, the distributed Bragg reflector 24 is configured to select a peak that corresponds to desired wavelength $\lambda_{MRR}$ from among a plurality of resonance transmittance peaks. As a result of this, when the gain of the optical amplifier 11 is greater than loss in the cavity, laser oscillation occurs.

In such a case, it is desirable that the reflection bandwidth of the distributed Bragg reflector 24 be sufficiently narrow so that only a peak corresponding to desired wavelength $\lambda_{MRR}$ is selected from among a plurality of resonance transmittance peaks. However, when the reflection bandwidth of the distributed Bragg reflector 24 is very narrow, it is difficult to produce a laser device in such a manner that desired wavelength $\lambda_{MRR}$ is allocated in that reflection band, deteriorating the production yield.

The solid line illustrated in FIG. 6 represents the reflection characteristics of the distributed Bragg reflector 24. In the example illustrated in FIG. 6, grating coefficient $\kappa_{DBR}$ and grating length $L_{DBR}$ of the distributed Bragg reflector 24 are $\kappa_{DBR}=200$ cm$^{-1}$ and $L_{DBR}=180$ μm, respectively. Also, center wavelength $\lambda_{DBR}$ of the reflection band is shifted by approximately 7 nm with respect to desired wavelength $\lambda_{MRR}$. As a result of this, desired wavelength $\lambda_{MRR}$ is not allocated in the reflection band of the distributed Bragg reflector 24.

Figure 7:
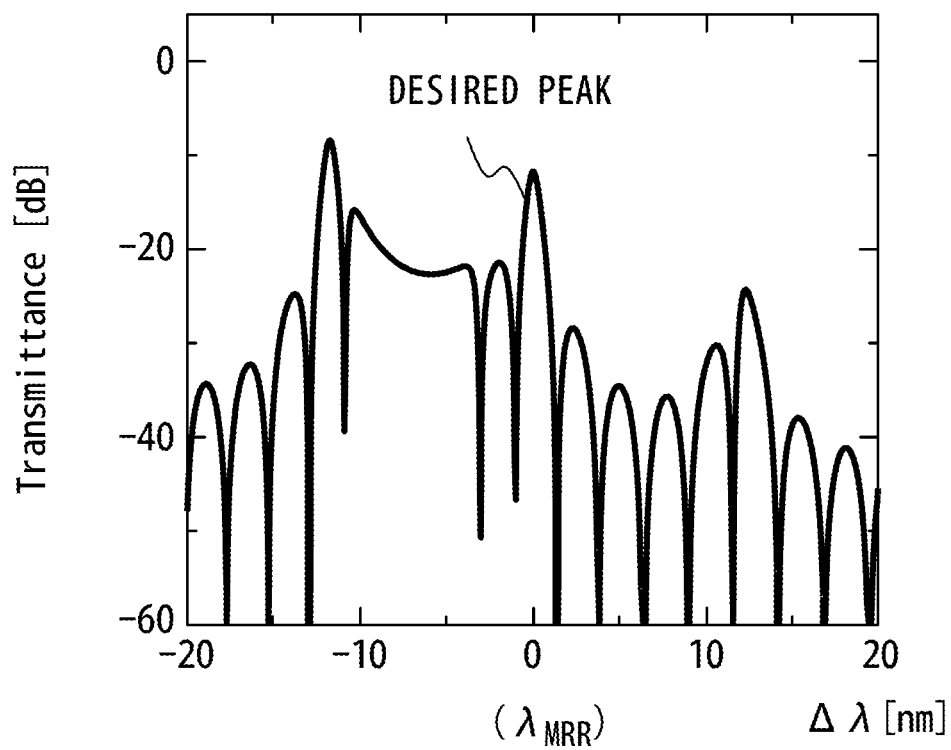
FIG. 7 illustrates the transmission spectrum corresponding to the state illustrated in FIG. 6.

FIG. 7 illustrates the transmission spectrum corresponding to the state illustrated in FIG. 6. This transmission spectrum is obtained by combining the transmission characteristics of the ring resonator 21 and the reflection characteristics of the distributed Bragg reflector 24 illustrated in FIG. 6. In this example, the loss at the peak wavelength next to desired wavelength $\lambda_{MRR}$ is smaller than the loss at desired wavelength $\lambda_{MRR}$. In other words, the optical power at the resonance transmittance peak adjacent to desired wavelength $\lambda_{MRR}$ may be greater than the optical power at desired wavelength $\lambda_{MRR}$. In this case, the laser oscillation may be unstable and mode hop may occur.

This problem may be solved if the reflection bandwidth of the distributed Bragg reflector 24 is made broader. When the reflection bandwidth of the distributed Bragg reflector 24 is broadened, allowable shift of the reflection band with respect to desired wavelength $\lambda_{MRR}$ is larger. In other words, even when a reflection bandwidth is shifted with respect to desired wavelength $\lambda_{MRR}$, desired wavelength $\lambda_{MRR}$ is allocated within the reflection band.

However, when the reflection bandwidth of the distributed Bragg reflector 24 is broadened, there is a possibility that laser oscillation occurs not only for desired wavelength $\lambda_{MRR}$ but also for a unnecessary resonance transmittance peak. For example, FIG. 8 illustrates a transmission spectrum obtained when the reflection bandwidth of the distributed Bragg reflector 24 is broadened. When the reflection bandwidth is broadened, respective losses corresponding to a plurality of peak wavelengths become smaller as illustrated in FIG. 8. In other words, there is a possibility that the optical feedback effect occurs not only on desired wavelength $\lambda_{MRR}$ but also on a unnecessary resonance transmittance peak. Accordingly, laser oscillation is unstable even in this configuration. Note that in the example illustrated in FIG. 8, $\kappa_{DBR}=600$ cm$^{-1}$ and $L_{DBR}=150$ μm are satisfied.

As described above, in the configuration illustrated in FIG. 5, when the reflection bandwidth of the distributed Bragg reflector 24 is narrow, it may be difficult to select a resonance transmittance peak of desired wavelength $\lambda_{MRR}$. By contrast, when the reflection bandwidth of the distributed Bragg reflector 24 is broad, unnecessary resonance transmittance peak is selected. In response to this, the laser device 1 of the embodiment includes the delay interferometer 30 between the optical amplifier 11 and the ring resonator 21 as illustrated in FIG. 3.

The delay interferometer 30 is designed so that the conditions below are satisfied.

(1) The delay interferometer 30 has a specified optical coupling ratio that is not zero with respect to desired wavelength $\lambda_{MRR}$ (2) The delay interferometer 30 is perfectly coupled to a peak wavelength adjacent to desired wavelength $\lambda_{MRR}$ (3) Delay optical waveguide length $L_D$ is the half of the perimeter of the ring resonator 21

In order to meet condition (1), $\kappa_{cp1}$ and $\kappa_{cp2}$ have to be different from each other. Also, in order to meet condition (2), $\kappa_{cp1}+\kappa_{cp2}=1$ has to be satisfied. Note that $\kappa_{cp1}$ represents the coupling coefficient of the optical coupler 31 and $\kappa_{cp2}$ represents the coupling coefficient of the optical coupler 32.

Figure 9:
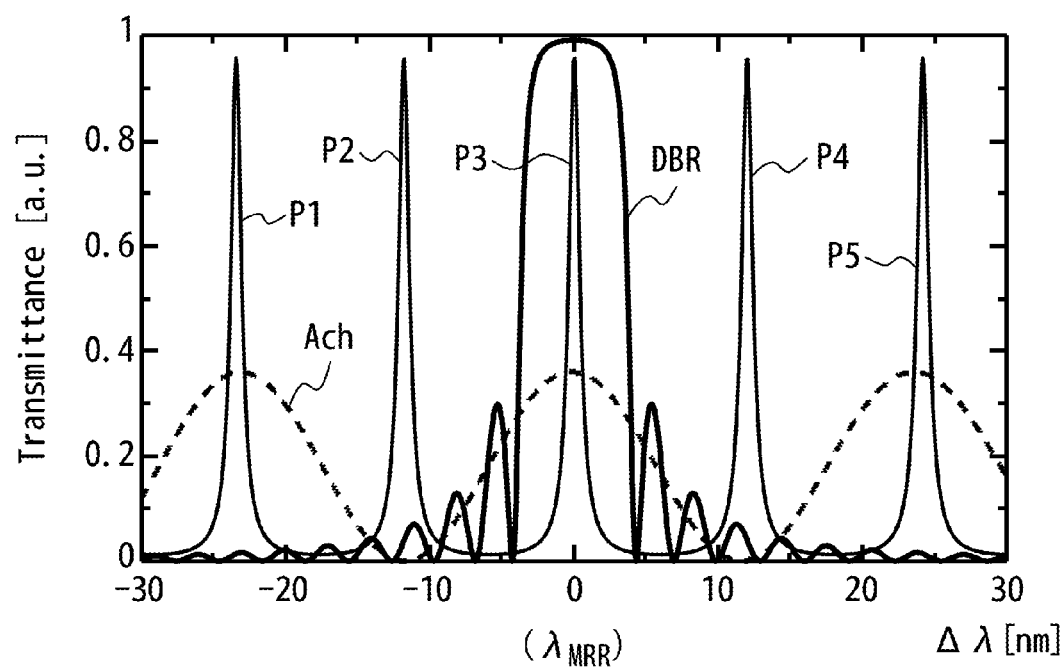
FIG. 9 illustrates characteristics of a ring resonator, a distributed Bragg reflector and a delay interferometer.

FIG. 9 illustrates the characteristics of the ring resonator 21, the distributed Bragg reflector 24 and the delay interferometer 30. The transmittance of the ring resonator 21 has peaks cyclically with respect to the wavelength. In the example illustrated in FIG. 9, resonance transmittance peaks P1 through P5 are obtained by the ring resonator 21 at the spacing of approximately 12 nm. Note that the wavelength with which resonance transmittance peak P3 emerges is referred to as desired wavelength $\lambda_{MRR}$. In other words, the laser device 1 selects resonance transmittance peak P3 from among a plurality of resonance transmittance peaks and outputs the selected resonance transmittance peak. Also in FIG. 9, the horizontal axis represents difference Δλ from desired wavelength $\lambda_{MRR}$, which is a reference wavelength.

The distributed Bragg reflector 24 has reflection band DBR that is determined by a grating coupling coefficient. In FIG. 9, the center wavelength of reflection band DBR is substantially identical to the wavelength of resonance transmittance peak P3 (i.e., desired wavelength $\lambda_{MRR}$). Note that in FIG. 9, the grating coupling coefficient and the grating length of the distributed Bragg reflector 24 satisfy $\kappa_{DBR}=200$ cm$^{-1}$ and $L_{DBR}=150$ μm, respectively.

In this example, the delay interferometer 30 is designed in such a manner that $\kappa_{cp1}=0.9$ and $\kappa_{cp2}=0.1$ are satisfied. When the radius of the ring resonator 21 is R, delay optical waveguide length $L_D$ is πR. In such a case, branching characteristic Ach of the delay interferometer 30 changes cyclically with respect to the wavelength as depicted by the dashed line in FIG. 9. The cycle of branching characteristic Ach is twice the cycle in which resonance transmittance peaks emerge due to the ring resonator 21. Note that branching characteristic Ach represents the ratio of the power of lightwaves output from port A to the total of the power of lightwaves output from ports A and B.

Branching characteristic Ach is 0.35 at desired wavelength $\lambda_{MRR}$ in the example illustrated in FIG. 9. In other words, branching ratio of the delay interferometer 30 is 35:65 at desired wavelength $\lambda_{MRR}$. Note that branching ration A:B represents the ratio between the power of lightwaves output from port A and the power of lightwaves output from port B.

When difference Δλ with respect to desired wavelength $\lambda_{MRR}$ increases, branching characteristic Ach decreases gradually, as illustrated in FIG. 9, and branching characteristic Ach is substantially zero at the wavelengths with which resonance transmittance peaks P2 and P4 are obtained. In other words, branching ratio A:B of the delay interferometer 30 is 0:100 at the wavelengths with which resonance transmittance peaks P2 and P4 are obtained. In such a case, the wavelength components of resonance transmittance peaks P2 and P4 are not guided to the ring resonator 21 via port A.

However, when difference Δλ increases further, branching characteristic Ach increases gradually, as illustrated in FIG. 9, and branching characteristic Ach is 0.35 at the wavelengths with which resonance transmittance peaks P1 and P5 are obtained.

In the laser device 1 having the above configuration, resonance transmittance peaks P1 through P5 are generated by the ring resonator 21. Although more resonance transmittance peaks are actually generated, peaks other than resonance transmittance peaks P1 through P5 are omitted. The reflection band DBR of the distributed Bragg reflector 24 is substantially identical to the wavelength of resonance transmittance peak P3 (i.e., the desired wavelength $\lambda_{MRR}$) in the example illustrated in FIG. 9. Thus, resonance transmittance peak P3 is reflected by the distributed Bragg reflector 24 at a high reflectance. In addition, branching characteristic Ach of the delay interferometer 30 is not zero at desired wavelength $\lambda_{MRR}$. In other words, the wavelength components of resonance transmittance peak P3 are guided to the ring resonator 21 from the delay interferometer 30 via port A. Accordingly, when gains by the optical amplifier 11 are greater than loss in the cavity formed by the reflector and the distributed Bragg reflector 24 at desired wavelength $\lambda_{MRR}$, resonance transmittance peak P3 oscillates. Thereby, laser light of desired wavelength $\lambda_{MRR}$ is generated.

Meanwhile, great losses are caused in the distributed Bragg reflector 24 for resonance transmittance peaks P1, P2, P4 and P5. Accordingly, no oscillation occurs for resonance transmittance peaks P1, P2, P4 or P5. In other words, the laser device 1 can prevent unnecessary laser oscillation. Note that oscillation of resonance transmittance peaks P2 and P4 are suppressed by other factors, which will be explained later in detail.

In the above example, the optical couplers 31 and 32 are designed in such a manner that they have coupling efficiency of $\kappa_{cp1}=0.9$ and $\kappa_{cp2}=0.1$. When the ratio of the coupling efficiency of the optical coupler 31 and that of the 32 is changed, the branching ratio A:B of the delay interferometer 30 (i.e., branching characteristic Ach of the delay interferometer 30) also changes.

When, for example, coupling efficiency $\kappa_{cp1}$ of the optical coupler 31 is increased and coupling efficiency $\kappa_{cp2}$ of the optical coupler 32 is decreased, branching characteristic Ach increases. In such a case, loss in the cavity formed by the reflector 12 and the distributed Bragg reflector 24 becomes smaller at desired wavelength $\lambda_{MRR}$, and accordingly, the gain threshold of the optical amplifier 11 for realizing laser oscillation becomes smaller.

When, by contrast, coupling efficiency $\kappa_{cp1}$ of the optical coupler 31 is decreased and coupling efficiency $\kappa_{cp2}$ of the optical coupler 32 is increased, branching characteristic Ach decreases. In such a case, the ratio of the power of lightwaves output via port B of the delay interferometer 30 becomes higher, making it easier for the laser device 1 to generate high-power laser light. However, such a case requires higher gain of the optical amplifier 11.

As described above, the designing of the delay interferometer 30 has influence on the characteristics of the laser device 1. Accordingly, it is desirable that the coupling efficiency of the optical couplers 31 and 32 be determined appropriately by taking the performance (for example gain) of the optical amplifier 11 and requirements (for example output power) about laser light generated by the laser device 1 into consideration.

FIG. 10 illustrates a case where reflection band DBR is shifted with respect to desired wavelength $\lambda_{MRR}$. In the example illustrated in FIG. 10, the center wavelength of reflection band DBR is shifted by 8 nm to the shorter wavelength side with respect to desired wavelength $\lambda_{MRR}$. In such a case, it is difficult to select only resonance transmittance peak P3 by using reflection band DBR of the distributed Bragg reflector 24. In other words, it is difficult to suppress another resonance transmittance peak (for example, resonance transmittance peak P2) by using reflection band DBR.

However, branching characteristic Ach of the delay interferometer 30 is substantially zero for resonance transmittance peaks P2 and P4. In other words, the wavelength components of resonance transmittance peak P2 or P4 are not substantially output from the delay interferometer 30 via port A. Accordingly, in the laser device 1, no oscillation occurs for resonance transmittance peak P2 or P4.

Similarly to branching characteristic Ach for resonance transmittance peak P3, branching characteristic Ach of the delay interferometer 30 for resonance transmittance peaks P1 and P5 is not zero. Accordingly, the wavelength components of resonance transmittance peaks P1 and P5 are output via port A from the delay interferometer 30, and may propagate to the distributed Bragg reflector 24 through the ring resonator 21. However, the reflectance of the distributed Bragg reflector 24 for resonance transmittance peaks P1 and P5 is much lower than the reflectance of the distributed Bragg reflector 24 for resonance transmittance peak P3 as illustrated in FIG. 10. In other words, in the cavity, losses for the resonance transmittance peaks P1 and P5 are much greater than a loss for resonance transmittance peak P3. Accordingly, when the laser device 1 is designed in the following manner, it is possible to cause oscillation of resonance transmittance peak P3 while preventing oscillation of resonance transmittance peaks P1 and P5. "Loss(P3)" represents a loss at the wavelength of resonance transmittance peak P3 in the cavity. "Loss (P1,P5)" represents losses at the wavelengths of resonance transmittance peaks P1 and P5 in the cavity. "G (SOA)" represents the gain of the optical amplifier 11.

Loss(P3)<G(SOA)<Loss(P1,P5)

FIG. 11 illustrates the sum of the three spectrums illustrated in FIG. 10. In this example, the vertical axis in FIG. 11 substantially corresponds to transmittance in the cavity of the laser device 1. In the case illustrated in FIG. 10, the optical power is maximum at the wavelength of resonance transmittance peak P3 (i.e., desired wavelength $\lambda_{MRR}$). Accordingly, the laser device 1 can generate laser oscillation only at desired wavelength $\lambda_{MRR}$ even when the center wavelength of reflection band DBR is shifted with respect to desired wavelength $\lambda_{MRR}$. However, shifting of the center wavelength of reflection band DBR with respect to desired wavelength $\lambda_{MRR}$ is assumed to be smaller than the free spectral range (FSR) of the ring resonator 21. Note that the free spectral range of the ring resonator 21 corresponds to the cycle in which the resonance transmittance peaks emerge and is approximately 12 nm in the example illustrated in FIG. 9 and FIG. 10.

In the example illustrated in FIG. 9 and FIG. 10, the reflection bandwidth of the distributed Bragg reflector 24 is narrower than the free spectral range of the ring resonator 21. Accordingly, when the center frequency of reflection band DBR is shifted with respect to desired wavelength $\lambda_{MRR}$ as illustrated in FIG. 10, a relatively great loss may be caused even at desired wavelength $\lambda_{MRR}$.

This problem is solved by broadening the reflection bandwidth of the distributed Bragg reflector 24. As an example, the reflection bandwidth of the distributed Bragg reflector 24 is configured to be broader than the free spectral range of the ring resonator 21.

Figure 12:
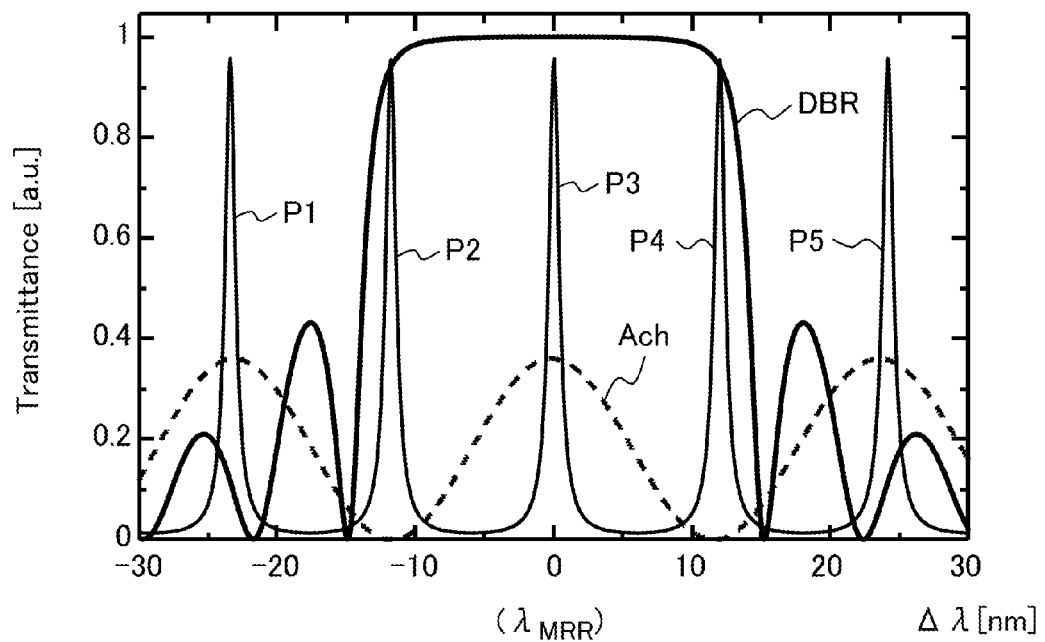
FIG. 12 illustrates a state where a reflection bandwidth of a distributed Bragg reflector is broadened.

FIG. 12 illustrates a state where the reflection bandwidth of the distributed Bragg reflector 24 is broadened. The ring resonator 21 and the delay interferometer 30 respectively have the same characteristics between FIG. 9 and FIG. 12. In other words, resonance transmittance peaks P1 through P5 are generated by the ring resonator 21. Also, the delay interferometer 30 provides branching characteristic Ach.

The width of reflection band DBR of the distributed Bragg reflector 24 is approximately 24 nm. The free spectral range of the ring resonator 21 is approximately 12 nm. In other words, the width of reflection band DBR of the distributed Bragg reflector 24 is approximately twice the free spectral range of the ring resonator 21. Reflection band DBR illustrated in FIG. 12 is implemented by setting the grating coefficient and the grating length of the distributed Bragg reflector 24 in such a manner that $\kappa_{DBR}=800\,cm^{-1}$ and $L_{DBR}=50\,\mu m$ are satisfied.

In the case illustrated in FIG. 12, while resonance transmittance peaks P2 through P4 are allocated in reflection band DBR, resonance transmittance peaks P1 and P5 are allocated out of reflection band DBR. Thus, in the distributed Bragg reflector 24, losses for resonance transmittance peaks P2 through P4 are small while losses for resonance transmittance peaks P1 and P5 are great. Accordingly, the laser device 1 can prevent oscillation of resonance transmittance peaks P1 and P5.

Branching characteristic Ach of the delay interferometer 30 is substantially zero for resonance transmittance peaks P2 and P4. In other words, great losses are caused in the delay interferometer 30 for resonance transmittance peaks P2 and P4. Accordingly, laser device 1 can prevent oscillation of resonance transmittance peaks P2 and P4. As described above, the laser device 1 can generate only laser light of desired wavelength $\lambda_{MRR}$.

Figure 13:
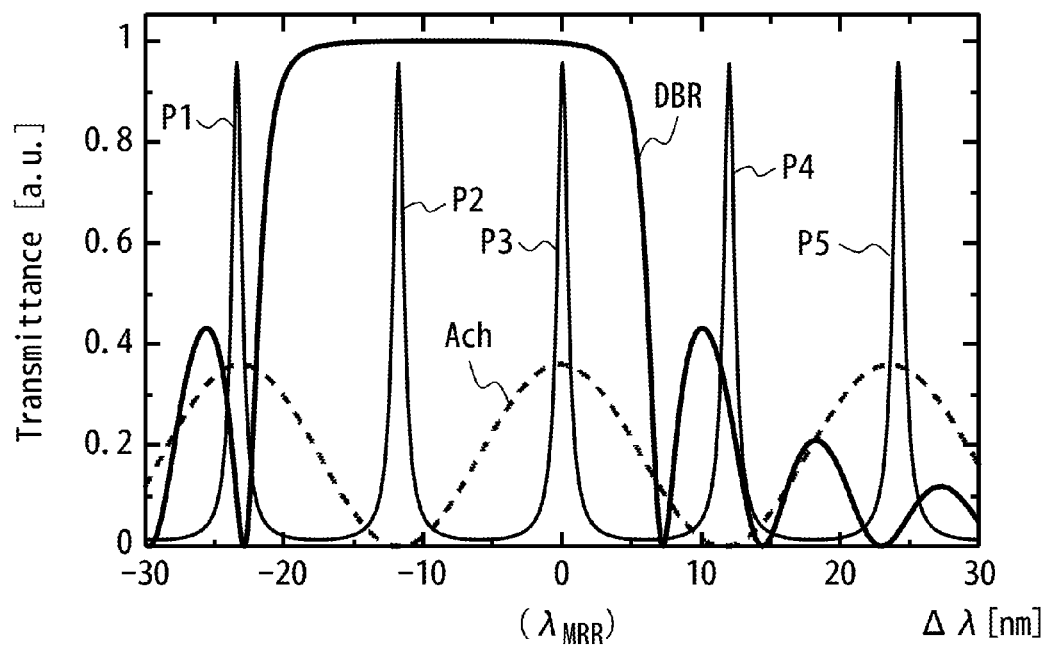
FIG. 13 illustrates a case where a reflection band is shifted with respect to a desired wavelength when a reflection bandwidth is broad.

FIG. 13 illustrates a case where reflection band DBR is shifted with respect to desired wavelength $\lambda_{MRR}$ and the reflection bandwidth is broad. In the example illustrated in FIG. 13, the center wavelength of reflection band DBR is shifted by 8 nm to the shorter wavelength side with respect to desired wavelength $\lambda_{MRR}$. The ring resonator 21 and the delay interferometer 30 respectively have the same characteristics between FIG. 12 and FIG. 13. Also, the width of reflection band DBR if the distributed Bragg reflector 24 is the same in FIG. 12 and FIG. 13.

In the example illustrated in FIG. 13, while resonance transmittance peaks P2 and P3 are allocated in reflection band DBR, resonance transmittance peaks P1, P4 and P5 are allocated out of reflection band DBR. Thus, in the distributed Bragg reflector 24, losses for resonance transmittance peaks P2 and P3 are small, while losses for resonance transmittance peaks P1, P4 and P5 are great. Accordingly, the laser device 1 can prevent oscillation of resonance transmittance peaks P1, P4 and P5.

Branching characteristic Ach of the delay interferometer 30 is substantially zero for resonance transmittance peak P2. In other words, great loss is caused in the delay interferometer 30 for resonance transmittance peak P2. Accordingly, laser device 1 can prevent oscillation for resonance transmittance peak P2. As described above, the laser device 1 can generate only laser light of desired wavelength $\lambda_{MRR}$ even when reflection band DBR is shifted with respect to desired wavelength $\lambda_{MRR}$.

FIG. 14 illustrates the sum of the three spectrums illustrated in FIG. 13. As illustrated in FIG. 13, the optical power is maximum at the wavelength with which resonance transmittance peak P3 emerges (i.e., desired wavelength $\lambda_{MRR}$) in the case illustrated in FIG. 13. Accordingly, even when the center frequency of reflection band DBR is shifted with respect to desired wavelength $\lambda_{MRR}$, the laser device 1 can cause laser oscillation only at desired wavelength $\lambda_{MRR}$.

If comparing the cases illustrated in FIG. 11 and FIG. 14, the peak at desired wavelength $\lambda_{MRR}$ is higher in the case illustrated in FIG. 11 than in the case illustrated in FIG. 14. In other words, when the width of reflection band DBR of the distributed Bragg reflector 24 is broadened, a loss at desired wavelength $\lambda_{MRR}$ becomes smaller.

As described above, when the reflection bandwidth of the distributed Bragg reflector 24 is broadened, the allowable shift of reflection band DBR with respect to desired wavelength $\lambda_{MRR}$ becomes broader in the production of the laser device 1, increasing the production yield. In addition, even when the reflection bandwidth of the distributed Bragg reflector 24 is broadened, great losses can be caused for unnecessary resonance transmittance peaks by using the delay interferometer 30 so that the laser oscillation becomes stable.

However, it is desirable that the reflection bandwidth of the distributed Bragg reflector 24 be narrower than three times of the free spectral range of the ring resonator 21. The reason is described below.

In the laser device 1, the cycle of branching characteristic Ach of the delay interferometer 30 is twice the free spectral range of the ring resonator 21. Accordingly, when the delay interferometer 30 transmits a resonance transmittance peak (referred to as a desired peak hereinafter), the resonance transmittance peaks adjacent to the desired peak are suppressed by the delay interferometer 30, whereas the resonance transmittance peaks that are secondary closest to the desired peak are transmitted by the delay interferometer 30. For example, when resonance transmittance peak P3 is the desired peak, resonance transmittance peaks P2 and P4 are suppressed by the delay interferometer 30, whereas the wavelength components of resonance transmittance peaks P1 and P5 are output through port A of the delay interferometer 30 and propagate to the distributed Bragg reflector 24.

When it is assumed that the reflection bandwidth of the distributed Bragg reflector 24 is broader than or equal to three times of the free spectral range of the ring resonator 21, the resonance transmittance peaks that are secondary closest to the desired peak may be allocated in reflection band DBR, even if the shift of reflection band DBR with respect to desired wavelength $\lambda_{MRR}$ is smaller than the free spectral width of the ring resonator 21. Here, the delay interferometer 30 transmits the resonance transmittance peaks that are secondary closest to the desired peak. Accordingly, in this case, there is a risk that the wavelength oscillates for the resonance transmittance peaks that are secondary closest to the desired peak.

Thus, in the laser device 1 according to the embodiment, it is desirable that the reflection bandwidth of the distributed Bragg reflector 24 be narrower than three times of the free spectral range of the ring resonator 21. According to this configuration, unnecessary oscillation is prevented and only laser light of desired wavelength $\lambda_{MRR}$ is generated.

As described above, according to a configuration of the embodiment, the production yield increases by configuring the reflection bandwidth of the distributed Bragg reflector 24 to be broader (for example, broader than or equal to the free spectral range of the ring resonator 21).

In a configuration of the embodiment, by utilizing the fact that the transmission characteristics of the delay interferometer 30 depends upon wavelengths, unnecessary resonance transmittance peaks that are generated by the ring resonator 21 are suppressed. This makes it possible to prevent unnecessary laser oscillation.

The laser device 1 of the embodiment outputs laser light through an optical waveguide (the output optical waveguide 25) other than the optical waveguide (the input optical waveguide 22) that is optically coupled to the ring resonator 21. Thus, output laser light is not greatly attenuated by the ring resonator 21 (and the distributed Bragg reflector 24). Accordingly, the laser device 1 of the embodiment can output high power laser light.

<Adjustment of Delay Interferometer>

It is desirable that the branching characteristic of the delay interferometer 30 and the transmission characteristics of 21 be synchronized in the laser device 1 of the embodiment. In other words, it is desirable that wavelength $\lambda_{AMZ}$ at which the branching characteristic Ach of the delay interferometer 30 becomes a peak and desired wavelength $\lambda_{MRR}$ corresponding to one of resonance transmittance peaks obtained by the ring resonator 21 be identical to each other. In such a case, the relation between $\lambda_{AMZ}$ and $\lambda_{MRR}$ are expressed by the equation below. Note that $n_{eq}$ represents the effective refractive index of a wire waveguide. $m_{AMZ}$ represents the diffraction order of the delay interferometer 30. $L_{MRR}$ represents the perimeter ($=2\pi R$) of the ring resonator 21. $m_{MRR}$ represents the diffraction order of the ring resonator 21.

$$\lambda_{AMZ} = \frac{n_{eq} \cdot L_D}{m_{AMZ}} \quad (1)$$

$$\lambda_{MRR} = \frac{n_{eq} \cdot L_{MRR}}{m_{MRR}} \quad (2)$$

As expressed by equations (1) and (2), it is possible to make $\lambda_{AMZ}$ and $\lambda_{MRR}$ identical to each other by appropriately configuring "$L_D/m_{AMZ}$" and/or "$L_{MRR}/m_{MRR}$". However, there is a possibility in some cases that $L_D$ becomes slightly greater or smaller than the half of $L_{MRR}$ when it is attempted to make $\lambda_{AMZ}$ and $\lambda_{MRR}$ identical to each other. In such a case, the free spectral range of the delay interferometer 30 slightly shifts from twice the free spectral range of the ring resonator 21.

In order to prevent oscillation of an unnecessary resonance transmittance peak generated by the ring resonator 21 in this situation, it is preferable that the branching ratio of the delay interferometer 30 at the peak wavelength is 0:100. However, even when the branching ratio of the delay interferometer 30 at the peak wavelength is not 0:100, it is possible to prevent oscillation of a wavelength corresponding to an unnecessary resonance transmittance peak when the ratio of the optical power at port A is sufficiently small. Accordingly, even when $L_D$ in the delay interferometer 30 is not exactly the half of the perimeter of the ring resonator 21, the laser device 1 can generate only laser light of a desired wavelength.

The laser device 1 of the embodiment may be equipped with a function of adjusting wavelength $\lambda_{AMZ}$ with which branching characteristic Ach becomes a peak by controlling the optical path length of the delay interferometer 30. As an example, the laser device 1 may be equipped with a function of adjusting wavelength $\lambda_{AMZ}$ by controlling the temperature of the optical waveguide of the delay interferometer 30.

Figure 15:
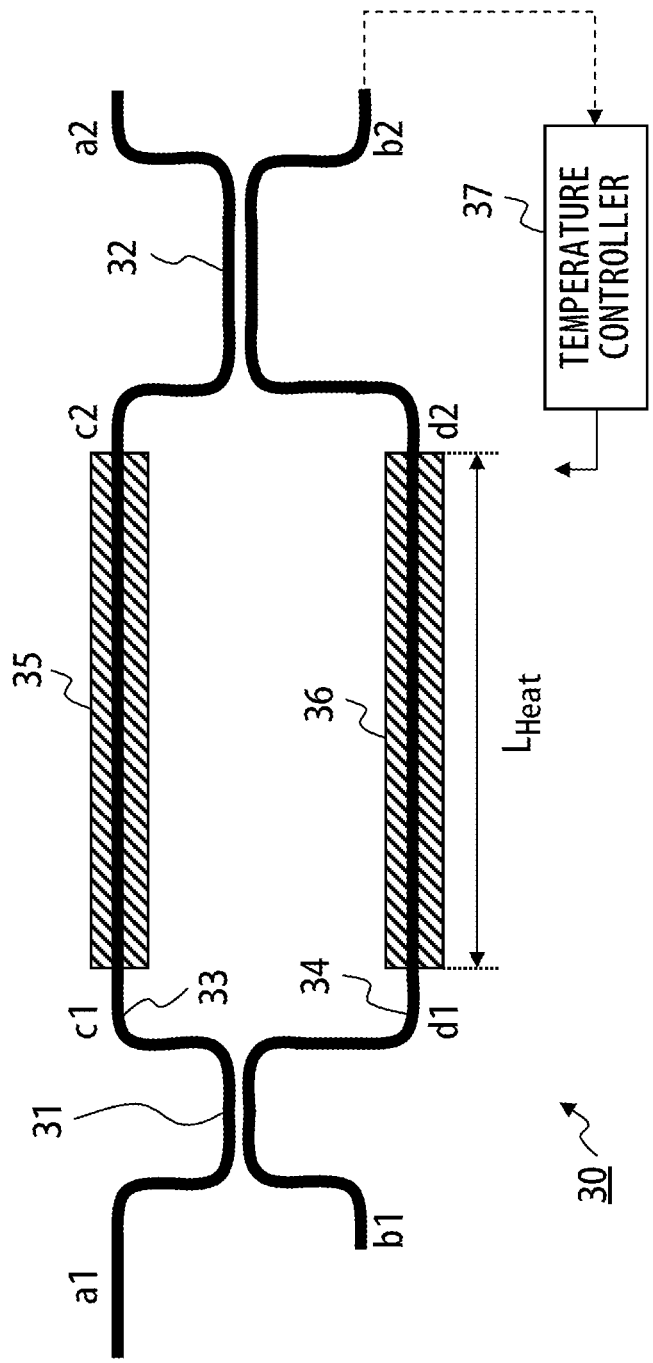
FIG. 15 illustrates a configuration that controls the temperature of a delay interferometer.

FIG. 15 illustrates a configuration that controls the temperature of the delay interferometer 30. In the example illustrated in FIG. 15, heater electrodes 35 and 36 are provided to the respective arms of the delay interferometer 30. The heater electrodes 35 and 36 are formed in the vicinity of the optical waveguides 33 and 34, respectively. A temperature controller 37 controls an electric current to be provided to the heater electrodes 35 and 36, and thereby controls the temperatures of the optical waveguides 33 and 34. The temperature controller 37 controls the temperature of the optical waveguides 33 and 34 while for example monitoring the optical level or optical power of the output optical waveguide 25 or input optical waveguide 22. The temperature controller 37 may be implemented by using for example a processor and a memory.

In this example, when the temperature of the upper arm (i.e., the optical waveguide 33) increases, the filter spectrum of the delay interferometer 30 shifts to the shorter wavelength side. When the temperature of the lower arm (i.e., the optical waveguide 34) increases, the filter spectrum of the delay interferometer 30 shifts to the longer wavelength side. In this case, the change amount ($\Delta\lambda_{AMZ}$) of the filter spectrum is expressed by the formula below. Note that $\Delta n_{eq}$ represents the change amount of the refractive index of an optical waveguide and $L_{Heat}$ represents the length of a heater electrode.

$$\Delta\lambda_{AMZ} = \frac{\Delta n_{eq} \cdot L_{Heat}}{m_{AMZ}} \quad (3)$$

As expressed by equation (3), $\Delta\lambda_{AMZ}$ is in proportion to $L_{Heat}$. In other words, desired $\Delta\lambda_{AMZ}$ can be obtained by appropriately determining $L_{Heat}$ even when $\Delta n_{eq}$ is constant. Therefore, when the heater electrodes 35 and 36 are configured to be longer, the filter spectrum of the delay interferometer 30 can be shifted greatly with respect to temperature change.

Note that it is not always necessary to provide heater electrodes to both of the upper and lower arms. That is, the laser device 1 may employ a configuration having a heater electrode on either the upper arm or the lower arm.

It is also possible to control the reflection spectrum of the distributed Bragg reflector 24 by utilizing temperature change. In such a case, for example, when the temperature of the distributed Bragg reflector 24 increases, the reflection spectrum shifts to the longer wavelength side. The change amount ($\Delta\lambda_{DBR}$) in the reflection spectrum is expressed by the formula below.

$$\Delta\lambda_{DBR} = \left(\frac{\Delta n_{eq}}{n_{eq}}\right) \cdot \lambda_{DBR} \quad (4)$$

As expressed by equation (4), $\Delta\lambda_{DBR}$ is not influenced by the length of a heater electrode formed in the vicinity of the distributed Bragg reflector 24 and is determined according to the ratio of the change in the refractive index. Accordingly, it may be difficult to greatly shift the reflection spectrum of the distributed Bragg reflector 24 by controlling the temperature of the distributed Bragg reflector 24.

FIG. 16 illustrates the relationship between the temperature control and wavelength tunable amount. In this example, the lengths the heater electrodes of the delay interferometer 30 and the distributed Bragg reflector 24 are both 200 μm.

As illustrated in FIG. 16, in the delay interferometer 30, wavelength change amount $\Delta\lambda_{AMZ}$ is approximately 40 nm (±20 nm) when the temperature change of 30 degrees is given by using the heater electrodes 35 and 36. In other words, the filter spectrum of the delay interferometer 30 can be shifted greatly by utilizing temperature control. Accordingly, even when the filter spectrum of the delay interferometer 30 is shifted from a desired oscillation wavelength due to manufacturing variations etc., it is possible to adjust the filter spectrum of the delay interferometer 30 to a desired oscillation wavelength by utilizing temperature control.

By contrast, in the distributed Bragg reflector 24, wavelength change amount $\Delta\lambda_{DBR}$ is approximately 3.5 nm when the temperature change of 30 degrees is given. Accordingly, when the shift of the reflection spectrum of the distributed Bragg reflector 24 is great due to manufacturing variations etc., it is difficult to adjust the center wavelength of the reflection spectrum of the distributed Bragg reflector 24 to a desired oscillation wavelength. However, the reflection bandwidth of the distributed Bragg reflector 24 is broad in the laser device 1 of the embodiment. In the example illustrated in FIG. 12 for example, the reflection bandwidth is 20 nm or broader. Accordingly, even when the center wavelength of the reflection spectrum of the distributed Bragg reflector 24 is shifted by several nanometers, a desired oscillation wavelength is allocated in that reflection spectrum.

As described above, manufacturing variations of the delay interferometer 30 are compensated for by temperature control. Also, manufacturing variations of the distributed Bragg reflector 24 are tolerated by broadening the reflection bandwidth. Accordingly, it is possible for the laser device 1 of the embodiment to provide stable laser oscillation.

<Manufacturing Method>

Explanations will be given for a method of manufacturing the laser device 1 of the embodiment by referring to FIG. 4. In this example, a laser device is formed by using SOI wafer. In the manufacturing process, an $SiO_2$ layer and an Si core layer are formed on the surface of an Si substrate 2. In this example, the thickness of the Si core layer is 250 nm. Patterning of the waveguide stripe structure is performed by using an optical exposure process. The optical semiconductor waveguide pattern is defined by a photomask of an optical exposure device. In such a case, electron beam exposure may be employed instead of optical exposure.

The rib waveguide structure having a slab structure with the height of approximately 50 nm is formed by performing dry etching (for example, reactive ion etching) on a drawn pattern. Thereafter, the waveguide stripe pattern is covered with the $SiO_2$ film. Thereby, the external resonation filter of the laser device 1 of the embodiment is implemented.

The heater electrodes are implemented by forming Ti thin films having approximately 100 through 500 nm on the upper surface of the $SiO_2$ film of the waveguide stripe. Wiring for providing electric current to the heater electrodes are formed by for example aluminum material.

When the optical amplifier (SOA) 11 and the external resonance filter are mounted on the semiconductor substrate in a hybrid manner, the laser device 1 of the embodiment is implemented. Note that the optical amplifier 11 and the external resonance filter may be coupled optically by using an optical fiber or the like.

<Optical Transmitter>

FIG. 17 illustrates a configuration of an optical transmitter having the laser device 1 of the embodiment. An optical transmitter 50 illustrated in FIG. 17 includes laser devices 1-1 through 1-4, optical modulators 51-1 through 51-4 and a multiplexer 52.

The respective laser devices 1-1 through 1-4 are implemented by the laser device 1 illustrated in FIG. 3. However, wavelengths λ1 through λ4 respectively generated by the laser devices 1-1 through 1-4 are different from each other. Laser light generated by the laser devices 1-1 through 1-4 are guided to the optical modulators 51-1 through 51-4, respectively.

Each of the optical modulators 51-1 through 51-4 is AP-MRR (All-pass Micro Ring Resonator) modulator. In other words, each of the optical modulators has a ring waveguide and a signal electrode formed in the vicinity of the ring waveguide. The optical modulator modulates input laser light by using data signal given to the signal electrodes and generates a modulated optical signal. Accordingly, modulated optical signals having different wavelengths are generated by the optical modulators 51-1 through 51-4. The multiplexer 52 multiplexes the plurality of modulated optical signals generated by the optical modulators 51-1 through 51-4. Thereby, a WDM optical signal including the plurality of modulated optical signals is generated.

In the above configuration, the ring resonator of the laser device 1-1 and the ring waveguide of the optical modulator 51-1 have substantially the same configuration and substantially the same perimeter. The ring resonator of the laser device 1-1 and the ring waveguide of the optical modulator 51-1 are formed at the same time and in the same manufacturing process, and therefore it is easy to manufacture them so that they have substantially the same configuration and substantially the same perimeter. Accordingly, the ring resonator of the laser device 1-1 and the ring waveguide of the optical modulator 51-1 have substantially the same resonance wavelength. Similarly, the ring resonators of the laser devices 1-2 through 1-4 and the ring waveguides of the optical modulators 51-2 through 51-4 have substantially the same configuration and substantially the same resonance wavelength, respectively.

Wavelengths λ1 through λ4 are allocated for example at the spacing of 200 GHz. In such a case, each ring resonator and each ring waveguide are formed for example in the following manner.

R1=8 μm

R2=R1−δR, R3=R2−δR, R4=R3−δR

δR=8 nm

R1 represents the radius of the ring resonator of the laser device 1-1 and the ring waveguide of the optical modulator 51-1. Similarly, R2 through R4 represent the radiuses of the ring resonators of the laser devices 1-2 through 1-4 and the ring waveguides of the optical modulators 51-2 through 51-4, respectively.

In the above configuration, in order to realize the optical feedback effect in the laser resonator, it is desirable that the shift of the center wavelength of the filter spectrum of the delay interferometer and the shift of the center wavelength of the reflection spectrum of the Bragg reflector be substantially the same each other. This configuration can be realized for example by adjusting cycle Λ of the grating diffraction grid of the Bragg reflector. In such a case, cycle Λ of the grating diffraction grid of the Bragg reflector is configured as follows.

Λ1=300.6 μm
Λ2=Λ1−δΛ, Λ3=Λ3−δΛ, Λ4=Λ3−δΛ,
δΛ=0.311 nm
Λ1 through Λ4 represent the cycles of the grating diffraction grids of the Bragg reflectors of the laser devices 1-1 through 1-4. Note that the grating coupling coefficient and the grating length of the Bragg reflector of each of the laser devices 1-1 through 1-4 are as represented by K=600 cm$^{-1}$ and L=150 μm, respectively.

In the above configuration, it is possible to change the frequency spacing of the WDM by adjusting δR and δΛ. For example, when beams of laser light are allocated at the spacing of 400 GHz, δR and δΛ are configured to be approximately 16 nm and approximately 0.622 nm, respectively.

Figure 18:
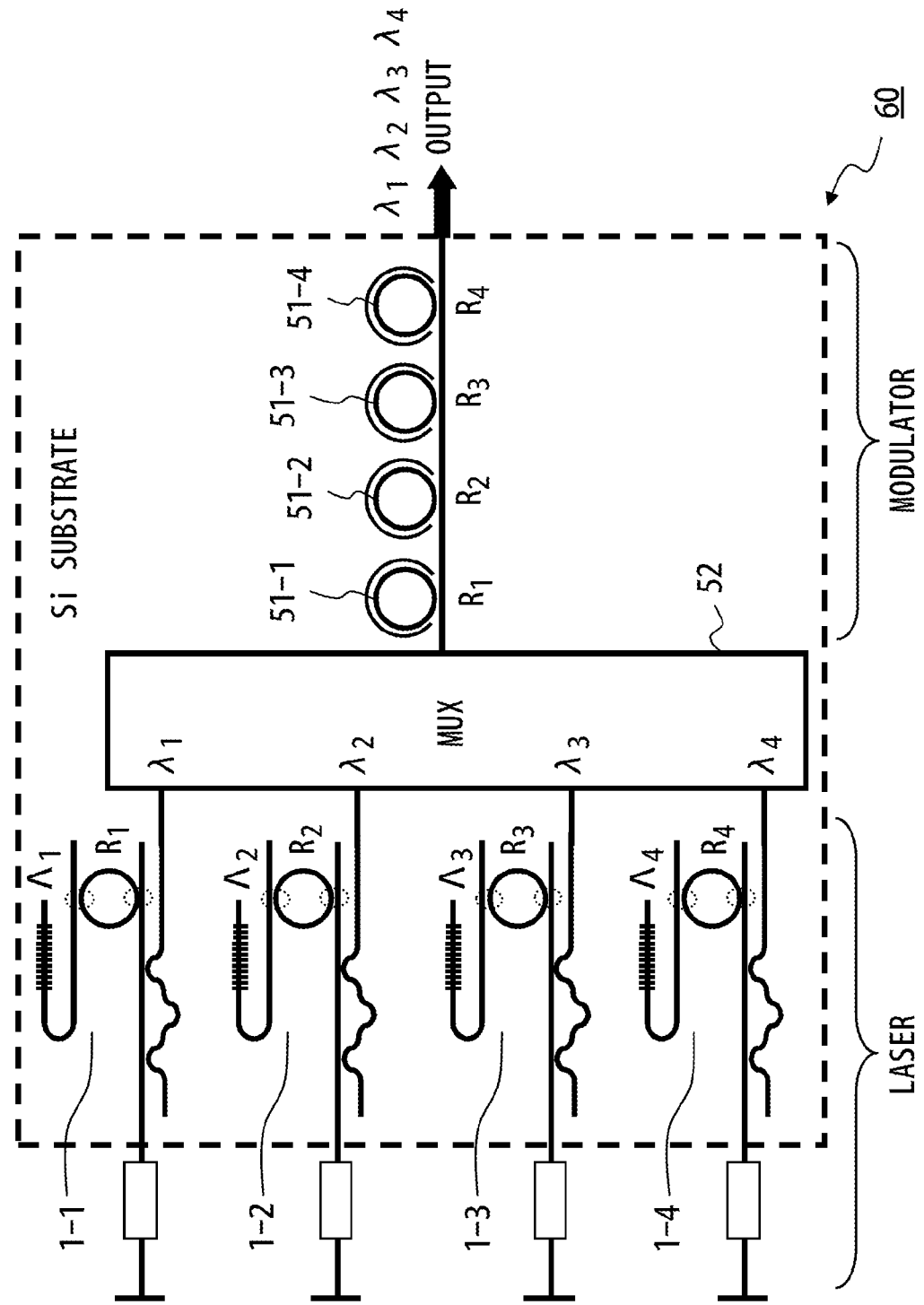
FIG. 18 illustrates another configuration of an optical transmitter having a laser device of an embodiment.

FIG. 18 illustrates another configuration of an optical transmitter having the laser device 1 of the embodiment. An optical transmitter 60 illustrated in FIG. 18 includes the laser devices 1-1 through 1-4, the optical modulators 51-1 through 51-4 and the multiplexer 52 similarly to the optical transmitter 50. However, in the optical transmitter 60, the multiplexer 52 multiplexes optical beams of λ1 through λ4. Light output from the multiplexer 52 is guided to the bus waveguide. The optical modulators 51-1 through 51-4 are optically coupled to the bus waveguide. The optical modulators 51-1 through 51-4 respectively modulate optical beams having corresponding wavelengths. Thereby, a WDM optical signal including a plurality of modulated optical signals is generated.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A laser device comprising:
   an optical amplifier that has a first optical end face and a second optical end face;
   a first reflector configured to reflect light output from the first optical end face of the optical amplifier;
   a ring resonator;
   an input optical waveguide that is optically coupled to the ring resonator;
   a reflector optical waveguide that is optically coupled to the ring resonator;
   a second reflector configured to reflect light that propagates in the reflector optical waveguide;
   an output optical waveguide; and
   a delay interferometer that includes a first optical coupler, a second optical coupler and a pair of optical waveguides formed between the first optical coupler and the second optical coupler, wherein
   the second optical end face of the optical amplifier and one port of the first optical coupler are optically coupled,
   a first port of the second optical coupler and the input optical waveguide are optically coupled, and
   a second port of the second optical coupler and the output optical waveguide are optically coupled.

2. The laser device according to claim 1, wherein
the first and second optical couplers are directional couplers.

3. The laser device according to claim 1, wherein
the first and second optical couplers are multi-mode interference couplers.

4. The laser device according to claim 1, wherein
a coupling coefficient of the first optical coupler is different from a coupling coefficient of the second optical coupler, and a sum of the coupling coefficient of the first optical coupler and the coupling coefficient of the second optical coupler is one.

5. The laser device according to claim 1, wherein
a difference between optical path lengths of the pair of optical waveguides in the delay interferometer is half of a perimeter of the ring resonator.

6. The laser device according to claim 1, wherein
the second reflector is a Bragg reflection mirror.

7. The laser device according to claim 6, wherein
a reflection bandwidth of the Bragg reflection mirror is smaller than three times of a free spectral range of the ring resonator.

8. The laser device according to claim 6, wherein
a reflection bandwidth of the Bragg reflection mirror is greater than a free spectral range of the ring resonator.

9. The laser device according to claim 1, further comprising:
   a heater electrode that is formed in the vicinity of at least one of the pair of optical waveguides in the delay interferometer; and
   a controller configured to control an electric current provided to the heater electrode based on optical power detected in the input optical waveguide or the output optical waveguide.

10. The laser device according to claim 1, wherein
the ring resonator, the input optical waveguide, the reflector optical waveguide, the second reflector, the output optical waveguide and the delay interferometer are formed on a semiconductor substrate.

11. An optical transmitter comprising:
    an optical amplifier that has a first optical end face and a second optical end face;
    a first reflector configured to reflect light output from the first optical end face of the optical amplifier;
    a ring resonator;
    an input optical waveguide that is optically coupled to the ring resonator;
    a reflector optical waveguide that is optically coupled to the ring resonator;
    a second reflector configured to reflect light that propagates in the reflector optical waveguide;
    an output optical waveguide;
    a delay interferometer that includes a first optical coupler, a second optical coupler and a pair of optical waveguides formed between the first optical coupler and the second optical coupler; and
    a ring modulator that is optically coupled to the output optical waveguide, wherein
    the second optical end face of the optical amplifier and one port of the first optical coupler are optically coupled,
    a first port of the second optical coupler and the input optical waveguide are optically coupled,
    a second port of the second optical coupler and the output optical waveguide are optically coupled, and
    an optical perimeter of the ring resonator and an optical perimeter of the ring modulator are substantially identical to each other.

* * * * *